(12) United States Patent
Choi et al.

(10) Patent No.: US 11,922,988 B2
(45) Date of Patent: Mar. 5, 2024

(54) DYNAMIC RANDOM ACCESS MEMORY DEVICE WITH LONG RETENTION AND OPERATING METHOD THEREOF

(71) Applicant: Korea Advanced Institute of Science and Technology, Daejeon (KR)

(72) Inventors: Yang-Kyu Choi, Daejeon (KR); Myung-Su Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 142 days.

(21) Appl. No.: 17/674,301

(22) Filed: Feb. 17, 2022

(65) Prior Publication Data

US 2022/0270660 A1   Aug. 25, 2022

(30) Foreign Application Priority Data

Feb. 23, 2021  (KR) .......................... 10-2021-0023886
Dec. 23, 2021  (KR) .......................... 10-2021-0185588

(51) Int. Cl.
*G11C 11/24*    (2006.01)
*G11C 11/404*   (2006.01)
*G11C 11/4096*  (2006.01)

(52) U.S. Cl.
CPC ........ *G11C 11/404* (2013.01); *G11C 11/4096* (2013.01)

(58) Field of Classification Search
CPC .................................................. G11C 11/404
USPC .......................................................... 365/149
See application file for complete search history.

(56) References Cited

U.S. PATENT DOCUMENTS

| 8,902,663 B1* | 12/2014 | Or-Bach | ................. H01L 29/78 365/185.08 |
|---|---|---|---|
| 2004/0036108 A1* | 2/2004 | Rudeck | ............. H01L 29/42324 257/314 |
| 2006/0145136 A1* | 7/2006 | Verhoeven | ............. H10B 12/03 257/14 |
| 2008/0251825 A1* | 10/2008 | Lee | ................... H01L 29/42392 257/E29.264 |

* cited by examiner

*Primary Examiner* — Hoai V Ho
(74) *Attorney, Agent, or Firm* — BKRIP LLC

(57) ABSTRACT

Disclosed are a DRAM device capable of storing charges for a long time and an operating method thereof. According to an embodiment, a DRAM device includes a channel region formed on a substrate, a gate insulating film region formed on the channel region, a floating gate region formed on the gate insulating film region, a transition layer region formed on the floating gate region, and a control gate region formed on the transition layer region and generating a potential difference with the floating gate region in response to a fact that a potential that is not less than a reference potential is applied and releasing at least one charge stored in the floating gate region or storing the at least one charge into the floating gate region, by generating a transition current due to the potential difference.

22 Claims, 10 Drawing Sheets

DYNAMIC RANDOM ACCESS MEMORY DEVICE WITH LONG RETENTION AND OPERATING METHOD THEREOF

CROSS-REFERENCE TO RELATED APPLICATIONS

A claim for priority under 35 U.S.C. § 119 is made to Korean Patent Application No. 10-2021-0023886 filed on Feb. 23, 2021 and Korean Patent Application No. 10-2021-0185588 filed on Dec. 23, 2021, in the Korean Intellectual Property Office, the disclosure of each of which is hereby incorporated herein in its entirety by this reference.

BACKGROUND

Embodiments of the inventive concept described herein relate to a dynamic random access memory (DRAM) device and an operating method thereof, and more particularly, relate to a technology for a DRAM device having excellent retention characteristics capable of storing charges for a long time.

Nowadays, a cell area of a DRAM device becomes smaller to reduce a chip unit cost and to increase a memory operating speed. Furthermore, retention characteristics of the DRAM device have deteriorated due to an increase in a leakage current by a short-channel effect of a transistor. In addition, to increase a cell capacitance value in a method to increase the sensing window, an area is increased by increasing an aspect ratio of a capacitor or a dielectric film of the capacitor is made of a material having a great dielectric constant. In this case, the development of a structure having a high aspect ratio and the development of a dielectric film material are limited due to problems in various processes.

As such, a capacitor-free DRAM (1T-DRAM) based on a 1T structure that is capable of operating with only a single transistor that does not require a capacitor has been proposed to overcome this limitations of the conventional 1transistor-1capacitor (1T-1C) DRAM. When the 1T-DRAM is an N-channel metal-oxide-semiconductor field effect transistor (NMOSFET), a memory operation is implemented by storing holes in a P-type floating body. Accordingly, the cell area may be reduced to $6F^2$ or less because a separate capacitor is not required for charge storage. However, because silicon-on-insulator (SOI) wafers are required to implement a floating body, not bulk-wafers. The production cost will inevitably rise. Moreover, the potential of a substrate is not adjusted by an external voltage due to the nature of a floating body structure, and thus a channel level becomes unstable. Furthermore, a gate dielectric film in the 1T-DRAM may be damaged by ion collisions that induce hole creation during a memory operation. For this reason, the 1T-DRAM has substantial limitations in replacing the conventional 1T-1C.

As another memory device for replacing 1T-1C, a thyristor having 'P-N-P-N-type' or 'N-P-P-N-type' structure, which stores charges in a floating body and implements a memory operation, has drawn attention. However, the thyristor has a high and complicated process difficulty due to the complex junction formation. In addition, the thyristor may have the instability of a channel level due to the use of the floating body structure.

In the meantime, because the demand for memory devices increases explosively with the development of new technologies such as artificial intelligence, an autonomous vehicle, and virtual reality/augmented reality (VR/AR), there is an urgent need for DRAM devices with power efficiency, miniaturization possibility, and excellent retention characteristics. In particular, there is a need for a memory device that is capable of substantially replacing the conventional DRAM of 1T-1C structure while having compatibility with a CMOS process implemented on the conventional bulk wafer, low device-to-device variability, and high reliability.

Accordingly, the following embodiments are intended to propose a DRAM device having a structure that overcomes and solves the limitations, disadvantages, and problems of the conventional DRAM device.

SUMMARY

Embodiments of the inventive concept provide a DRAM device that implements long retention characteristics, has a structure in which an upper gate region is modified instead of a channel region to improve compatibility with conventional processes, reduces process complexity and manufacturing cost, and has a reduced chip size by removing a sense amplifier, which has been essentially used in the conventional 1T-1C DRAM, to implement a very large sensing window while solving structural limitations of the conventional 1T-1C DRAM and 1T-DRAM devices by not using capacitors and floating bodies.

However, the technical problems to be solved by the inventive concept are not limited to the above problems, and may be variously expanded without departing from the technical spirit and scope of the inventive concept.

According to an exemplary embodiment, a DRAM device includes a channel region formed on a substrate, a gate insulating film region formed on the channel region, a floating gate region formed on the gate insulating film region, a transition layer region formed on the floating gate region, and a control gate region formed on the transition layer region and generating a potential difference with the floating gate region in response to a fact that a potential that is not less than a reference potential is applied and releasing at least one charge stored in the floating gate region or storing the at least one charge into the floating gate region, by generating a transition current due to the potential difference.

According to one aspect, the control gate region performs a read operation by releasing the at least one charge stored in the floating gate region and performs a write operation by storing the at least one charge into the floating gate region.

According to another aspect, the control gate region performs the read operation or the write operation in a method of changing a resistance state of the channel region in response to a fact that the at least one charge passes through an energy barrier by the transition layer region due to the potential difference with the floating gate region.

According to another aspect, an area of the control gate region or an area of the transition layer region is smaller than an area of the floating gate region.

According to another aspect, the control gate region is formed of at least one material of a metal, a two or three metal alloy, n+ polycrystalline silicon, p+ polycrystalline silicon, or silicide.

According to another aspect, the transition layer region is formed of at least one material of silicon (Si), germanium (Ge), group III-V compound, 2-D material, silicon nitride ($Si_3N_4$), nitride, silicon oxynitride (SiON), silicon oxide ($SiO_2$), oxide, aluminum oxide ($Al_2O_3$), IGZO, hafnium oxide ($HfO_2$), a transition layer material, a semiconductor material, or a solid electrolyte material.

According to another aspect, the floating gate region has one structure among a protruded gate structure including a planar-gate structure, a multiple-gate structure, and a gate-all-around structure or a buried gate structure depending on a structure of the channel region.

According to another aspect, the floating gate region has the protruded gate structure used in one of a finFET, a tri-gate MOSFET, a Π-gate MOSFET, a Ω-gate MOSFET, a gate-all-around MOSFET, a bulk finFET, or a bulk gate-all-around MOSFET.

According to another aspect, the floating gate region has the buried gate structure used in at least one of a buried gate MOSFET, a recessed gate MOSFET, a sphere-shaped recessed gate MOSFET, a saddle finFET, a groove gate MOSFET, or a V-groove gate MOSFET.

According to another aspect, the floating gate region is formed of at least one material of a metal, a two or three metal alloy, n+ polycrystalline silicon, p+ polycrystalline silicon, or silicide.

According to another aspect, the gate insulating film region is formed of at least one of silicon oxide ($SiO_2$), silicon nitride ($Si_3N_4$), silicon oxynitride (SiON), hafnium oxide ($HfO_2$), aluminum oxide ($Al_2O_3$), zirconium oxide ($ZrO_2$), hafnium zirconium oxide (HZO), or hafnium oxynitride (HfON).

According to another aspect, the DRAM device further includes a source region and a drain region formed on left and right sides of the channel region when the DRAM device is implemented as a horizontal transistor, and formed at upper and lower ends of the channel region when the DRAM device is implemented as a vertical transistor.

According to another aspect, the source region and the drain region are formed of one of n-type silicon, p-type silicon, or metal silicide.

According to another aspect, when the source region and the drain region are formed of the n-type silicon or the p-type silicon, the source region and the drain region are formed based on at least one method of diffusion, solid-phase diffusion, epitaxial growth, selective epitaxial growth, ion implantation or subsequent heat treatment.

According to another aspect, when the source region and the drain region are formed of a metal silicide, bonding is improved by using dopant segregation.

According to another aspect, the channel region, the source region, and the drain region are formed of materials identical to one another.

According to another aspect, the channel region, the source region, and the drain region are formed of at least one of silicon, germanium, silicon-germanium, strained silicon, strained germanium, strained silicon-germanium, silicon on insulator (SOI), or group III-V semiconductor materials.

According to another aspect, the channel region has either a protruded channel structure or a buried channel structure, which includes a planar structure, a fin structure, a nanosheet structure, or a nanowire structure.

According to another aspect, the channel region has the protruded channel structure used in one of a FinFET, a tri-gate MOSFET, a Π-gate MOSFET, a Ω-gate MOSFET, a gate-all-around MOSFET, a bulk finFET, or a bulk gate-all-around MOSFET.

According to another aspect, the channel region has the buried channel structure used in at least one of a buried gate MOSFET, a recessed gate MOSFET, a sphere-shaped recessed gate MOSFET, a saddle finFET, a groove gate MOSFET, or a V-groove gate MOSFET.

According to an exemplary embodiment, an operating method of a DRAM device including a channel region formed on a substrate, a gate insulating film region formed on the channel region, a floating gate region formed on the gate insulating film region, a transition layer region formed on the floating gate region, and a control gate region formed on the transition layer region includes generating a potential difference with the floating gate region in response to a fact that a potential that is not less than a reference potential is applied and performing a memory operation by generating a transition current due to the potential difference. The performing of the memory operation includes one of releasing at least one charge stored in the floating gate region or storing the at least one charge into the floating gate region.

According to an exemplary embodiment, a manufacturing method of a DRAM device includes preparing a transistor structure including a channel region formed on a substrate, a gate insulating film region formed on the channel region, and a floating gate region formed on the gate insulating film region, forming a transition layer region on the floating gate region in the transistor structure, and forming a control gate region on the transition layer region.

According to an exemplary embodiment, a DRAM device includes a channel region formed on a substrate, a gate insulating film region formed on the channel region, a floating gate region formed on the gate insulating film region, a transition layer region formed on the floating gate region, and a control gate region formed on the transition layer region, and generating a potential difference with the floating gate region in response to a fact that a potential that is not less than a reference potential is applied and releasing at least one charge stored in the floating gate region or storing the at least one charge into the floating gate region, by generating a transition current due to the potential difference. An area of the control gate region or an area of the transition layer region is smaller than an area of the floating gate region.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1A:
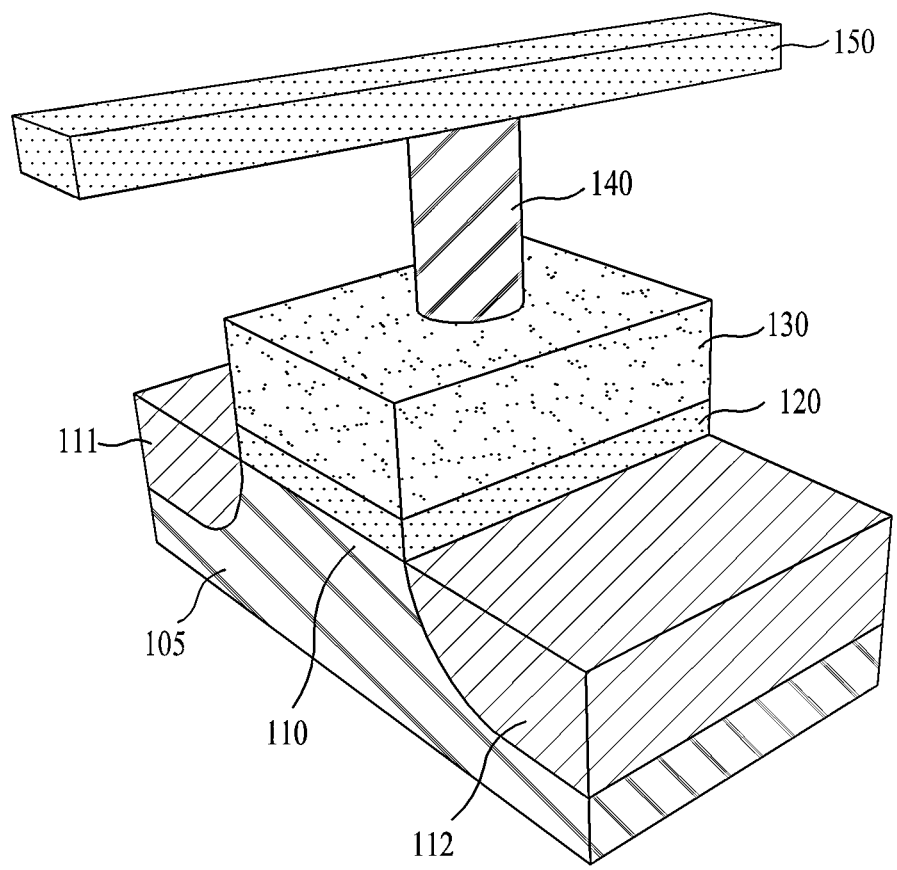
FIG. 1A is a perspective view illustrating a DRAM device, according to an embodiment.

Hereinafter, a description will be given in detail for exemplary embodiments of the present invention with reference to the following drawings. However, the inventive concept are not limited or restricted by the embodiments. Further, the same reference signs/numerals in the drawings denote the same members.

Furthermore, the terminologies used herein are used to properly express the embodiments of the inventive concept, and may be changed according to the intentions of a viewer or the manager or the custom in the field to which the inventive concept pertains. Therefore, definition of the terms should be made according to the overall disclosure set forth herein. For example, in the specification, the singular forms include plural forms unless particularly mentioned. Furthermore, the terms "comprises" and/or "comprising" used herein does not exclude presence or addition of one or more other components, steps, operations, and/or elements in addition to the aforementioned components, steps, operations, and/or elements.

Moreover, it should be understood that various embodiments of the inventive concept are not necessarily mutually exclusive although being different from each other. For example, specific shapes, structures, and characteristics described herein may be implemented in other embodiments without departing from the spirit and scope of the inventive concept in relation to one embodiment. Besides, it should be understood that the location, arrangement, or configuration of individual components in each of presented categories of an embodiment may be changed without departing from the spirit and scope of the inventive concept.

Hereinafter, because a memory characteristic has a very long retention characteristic, a DRAM device according to an embodiment may be referred to as a "long retention (LR)-DRAM". Furthermore, hereinafter, the DRAM device may be a three-terminal device.

Figure 1B:
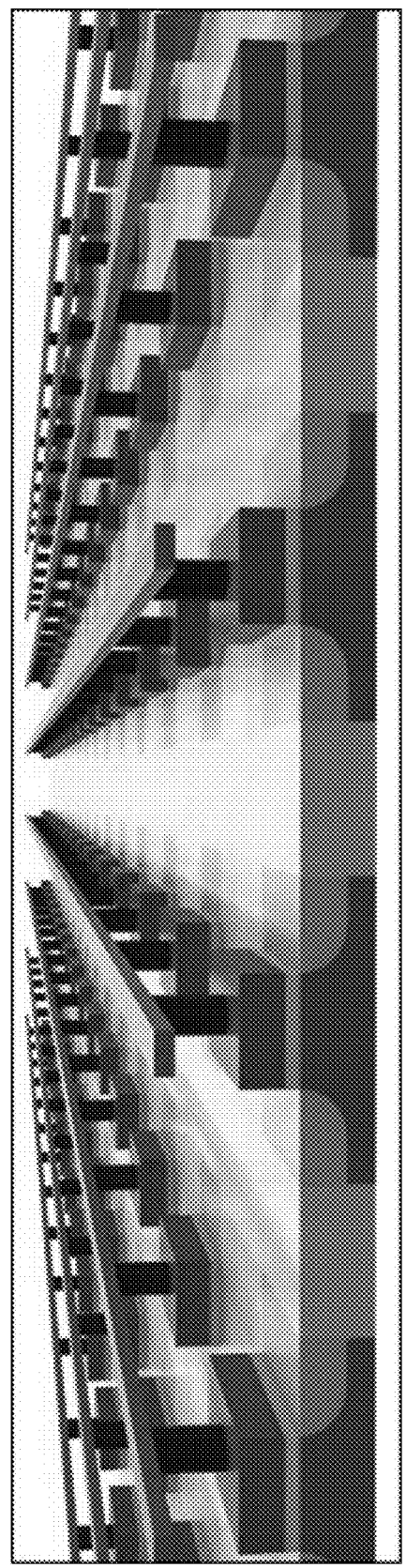
FIG. 1B is a perspective view illustrating a DRAM array in which the DRAM device shown in FIG. 1A are connected in an array structure.
Figure 2:
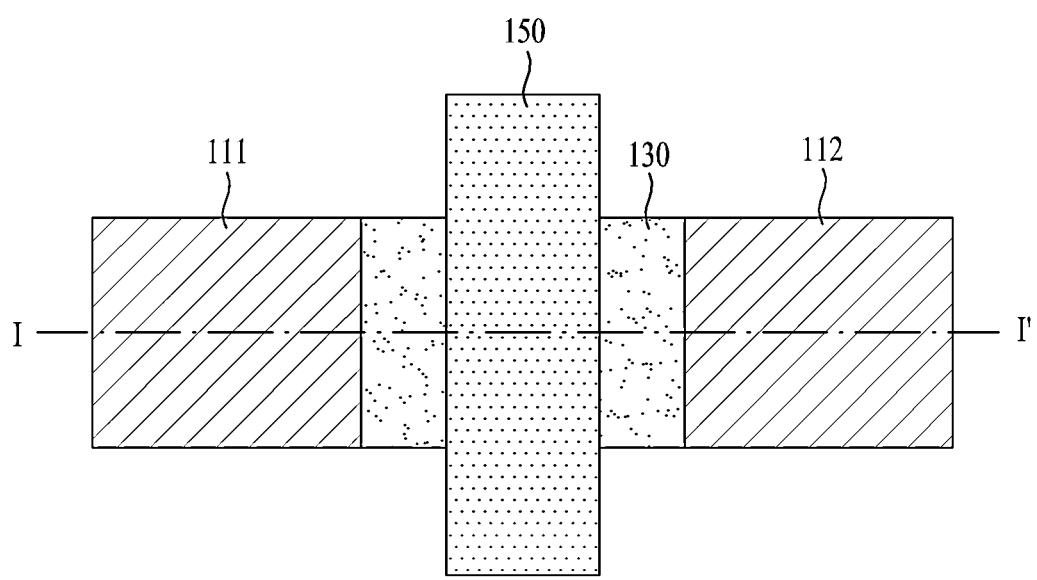
FIG. 2 is a plan view illustrating the DRAM device shown in FIG. 1A.
Figure 3:
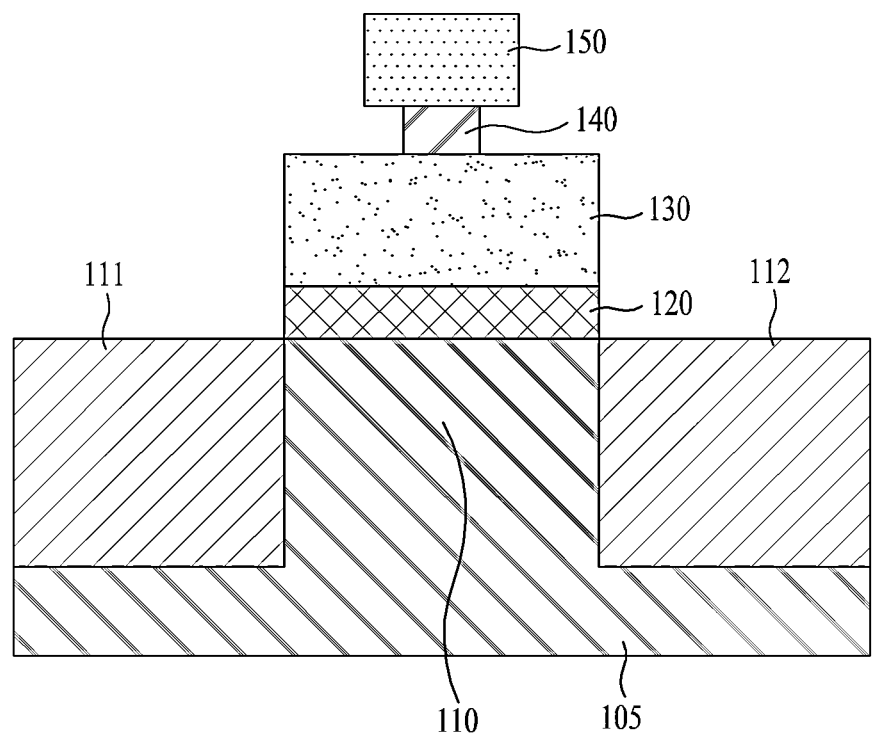
FIG. 3 is a cross-sectional view illustrating a cross-section of a DRAM device taken along line I-I' shown in FIG. 2.
Figure 4:
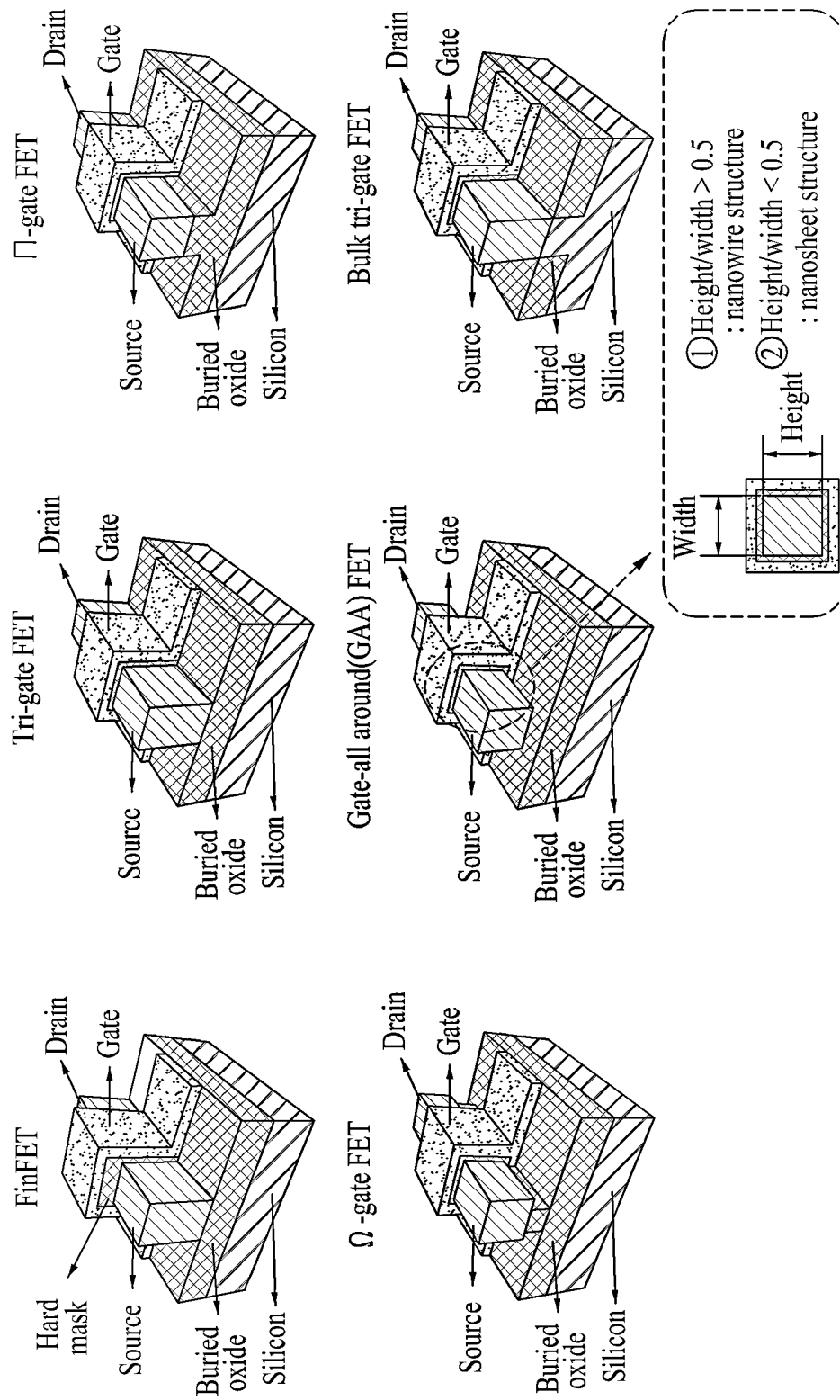
FIG. 4 is a perspective view illustrating various protruded gate FET structures to describe a structure of a channel region and a floating gate region included in the DRAM device shown in FIG. 1A.
Figure 5:
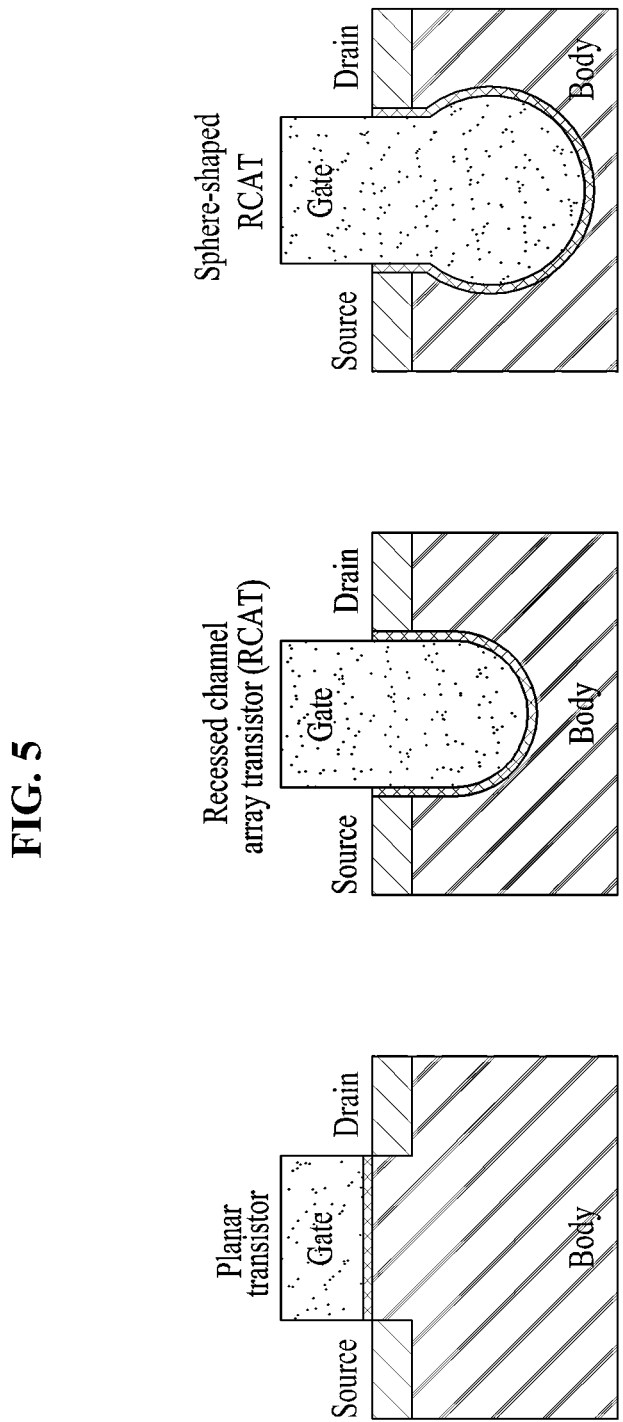
FIG. 5 is a cross-sectional view illustrating various protruded gate FET structures to describe a structure of a channel region and a floating gate region included in the DRAM device shown in FIG. 1A.

FIG. 1A is a perspective view illustrating a DRAM device, according to an embodiment. FIG. 1B is a perspective view illustrating a DRAM array in which the DRAM device shown in FIG. 1A are connected in an array structure. FIG. 2 is a plan view illustrating the DRAM device shown in FIG. 1A. FIG. 3 is a cross-sectional view illustrating a cross-section of a DRAM device taken along line I-I' shown in FIG. 2. FIG. 4 is a perspective view illustrating various protruded gate FET structures to describe a structure of a channel region and a floating gate region included in the DRAM device shown in FIG. 1A. FIG. 5 is a cross-sectional view illustrating various protruded gate FET structures to describe a structure of a channel region and a floating gate region included in the DRAM device shown in FIG. 1A.

According to an embodiment, a DRAM device has a structure in which a transition layer region and a control gate region are arranged on the gate of a conventional MOSFET. The DRAM device may have a structure in which various MOSFETs used in the field are located at the lower portion. For example, the DRAM device may have a structure in which a transition layer region and a control gate region are arranged on the MOSFET of a protruded structure or a buried structure shown in FIGS. 4 and 5 in addition to a planar MOSFET shown in FIGS. 1A, 2, and 3.

Referring to FIGS. 1A, 2, and 3, according to an embodiment, a DRAM device 100 may include a channel region 110 formed on a substrate 105, a source region 111 and a drain region 112 formed on both left and right sides of the channel region 110, a gate insulating film region 120 formed on the channel region 110, a floating gate region 130 formed on the gate insulating film region 120, a transition layer region 140 formed on the floating gate region 130, and a control gate region 150 formed on the transition layer region 140.

The substrate 105 may be formed of at least one of silicon, germanium, silicon-germanium, strained silicon, strained germanium, strained silicon-germanium, silicon on insulator (SOI), or group III-V semiconductor materials.

The channel region 110 may have either a protruded channel structure or a buried channel structure, which includes a planar structure, a fin structure, a nanosheet structure, or a nanowire structure.

For example, the channel region 110 may have the protruded channel structure used in one of a finFET, a tri-gate MOSFET, a Π-gate MOSFET, a Ω-gate MOSFET, a gate-all-around MOSFET, a bulk finFET, or a bulk gate-all-around MOSFET. For a more specific example, as shown in FIG. 4, the channel region 110 may be formed to have a protruded channel structure such as a nanosheet structure having a channel aspect ratio (height/width) of 0.5 or less, a nanowire structure having a channel aspect ratio of 0.5 or more, a multi-nanowire structure, or the like.

As another example, as shown in FIG. 5, the channel region 110 may be formed to have a buried channel structure used in at least one of a buried gate MOSFET, a recessed gate MOSFET, a sphere-shaped recessed gate MOSFET, a saddle finFET, a groove gate MOSFET, or a V-groove gate MOSFET.

It is described that the source region 111 and the drain region 112 are formed on the left and right sides of the channel region 110 as the DRAM device 100 is implemented as a horizontal transistor as shown in the drawing. However, it is not limited thereto. For example, when the DRAM device 100 is implemented as a vertical transistor, the source region 111 and the drain region 112 may be formed at upper and lower ends of the channel region 110.

At this time, the source region 111 and the drain region 112 may be formed of one of n-type silicon, p-type silicon, or metal silicide. For example, when formed of n-type silicon or p-type silicon, the source region 111 and the drain region 112 may be formed based on at least one method of diffusion, solid-phase diffusion, epitaxial growth, selective epitaxial growth, ion implantation or subsequent heat treatment. When the source region 111 and the drain region 112 are formed of the metal silicide such as tungsten (W), titanium (Ti), cobalt (Co), nickel (Ni), erbium (Er), ytterbium (Yb), samarium (Sm), yttrium (Y), gadorium (Gd), turbul (Tb), cerium (Ce), platinum (Pt), lead (Pb), or iridium (Jr), bonding may be improved by using dopant segregation.

The source region 111 and the drain region 112 may be formed of the same material as the channel region 110. For example, the channel region 110, the source region 111, and the drain region 112 may be formed of at least one of silicon, germanium, silicon-germanium, strained silicon, strained germanium, strained silicon-germanium, silicon on insulator (SOI), or group III-V semiconductor materials. However, it is not limited thereto. For example, the channel region 110, the source region 111, and the drain region 112 may be formed of different materials from one another.

The gate insulating film region 120 may be a component that insulates the floating gate region 130 and the channel region 110 and may be formed of any insulating material that does not have memory characteristics. For example, the gate insulating film region 120 may be formed of at least one of silicon oxide (SiO$_2$), silicon nitride (Si$_3$N$_4$), silicon oxynitride (SiON), hafnium oxide (HfO$_2$), aluminum oxide (Al$_2$O$_3$), zirconium oxide (ZrO$_2$), hafnium zirconium oxide (HZO), or hafnium oxynitride (HfON).

The floating gate region 130 may be formed of at least one material of a metal, a two or three metal alloy, n+ polycrystalline silicon, p+ polycrystalline silicon, or silicide. Because the floating gate region 130 is positioned between the control gate region 150 and the channel region 110, it may be referred to as an "internal gate". Here, the silicide may include, for example, tungsten silicide (WSi$_2$), titanium silicide (TiSi$_2$), cobalt silicide (CoSi or CoSi$_2$), nickel silicide (NiSi or NiSi$_2$), and the like.

As such, according to the structure of the channel region 110, the floating gate region 130 may have one structure among a protruded gate structure including a multiple-gate structure and a gate-all-around structure, which are shown in FIG. 4, or a buried gate structure shown in FIG. 5 as well as a planar-gate structure.

For example, the floating gate region 130 may have the protruded gate structure used in one of a finFET, a tri-gate MOSFET, a Π-gate MOSFET, a Ω-gate MOSFET, a gate-all-around MOSFET, a Bulk finFET, or a bulk gate-all-around MOSFET.

As another example, the floating gate region 130 may have the buried gate structure used in at least one of a buried gate MOSFET, a recessed gate MOSFET, a sphere-shaped recessed gate MOSFET, a saddle finFET, a groove gate MOSFET, or a V-groove gate MOSFET.

The transition layer region 140 may be a component insulating the floating gate region 130 and the control gate region 150, and may be formed of at least one material of silicon (Si), germanium (Ge), group III-V compound, 2-D material (at least one of carbon nanotube, MoS2, and graphene), silicon nitride (Si$_3$N$_4$), nitride, silicon oxynitride (SiON), silicon oxide (SiO$_2$), oxide, aluminum oxide (Al$_2$O$_3$), IGZO, hafnium oxide (HfO$_2$), a transition layer material, a semiconductor material (SrTiO$_3$, SrZrO$_3$, NiO, TiO$_2$, HfO$_x$, AlO$_x$, NiO$_x$, TiO$_x$, TaO$_x$, TaN, Cu$_x$O, CuO$_x$, TiN, TaN, WO$_x$, SiN$_x$, VO$_2$, IrO$_2$, ZrO$_x$, ZnO, NbO$_x$, IGZO, HZO, HfON), or a solid electrolyte material (a sulfide-based material[Li$_{10}$GeP$_2$S$_{12}$, Li$_{9.54}$Si$_{1.74}$P$_{1.44}$S$_{11.7}$C$_{10.3}$, argyrodite, lithium phosphorus sulfide (LPS), LPS+LiCl], an oxide-based material [perovskite, NASICON (Na$_{1+x}$Zr$_2$Si$_x$P$_{3-x}$O$_{12}$, 0<x<3), LISICON(Li$_{2+2x}$Zn$_{1-x}$GeO$_4$), LiPON(Li$_x$PO$_y$N$_z$), garnet], or an ion conductive polymer [polyethylene oxide (PEO), polyethylene glycol (PEG), polyethylene glycol dimethacrylate (PEGDMA), polytetrafluoroethylene (PTFE), polyether ether ketone (PEEK), or nafion(C$_7$HF$_{13}$O$_5$S·C$_2$F$_4$)]). That is, the transition layer region 140 may be composed of a single material having one of the selected materials described above, or may be composed of a mixture of the above-mentioned materials.

The control gate region 150 may generate a potential difference with the floating gate region 130 in response to a fact that a potential that is not less than a reference potential is applied, and may release at least one charge stored in the floating gate region 130 or store at least one charge into the floating gate region 130 by generating a transition current due to the potential difference.

That is, in such a method of changing a resistance state of the channel region 110 in response to a fact that at least one charge passes through an energy barrier by the transition layer region 140 due to a potential difference with the floating gate region 130, the control gate region 150 may perform a read operation by releasing at least one charge stored in the floating gate region 130 and may perform a write operation by storing at least one charge into the floating gate region 130.

At this time, in response to a fact that an electric potential is applied to the control gate region 150, the transition layer region 140 supplies a transition current to the floating gate region 130 depending on the potential difference between gates at both ends. To this end, the control gate region 150 may be formed adjacent to the floating gate region 130 through the transition layer region 140.

The control gate region 150 may be formed of at least one material of a metal, a two or three metal alloy, n+ polycrystalline silicon, p+ polycrystalline silicon, or silicide (tungsten silicide (WSi$_2$), titanium silicide (TiSi$_2$), cobalt silicide (CoSi or CoSi$_2$) or nickel silicide (NiSi or NiSi$_2$), or the like).

In particular, an area of the control gate region 150 or an area of the transition layer region 140 may be smaller than an area of the floating gate region 130. Accordingly, an area where the control gate region 150 or the transition layer region 140 is in contact with the floating gate region 130 is smaller than the total area of the floating gate region 130. However, it is not limited thereto. For example, under the premise that the area where the control gate region 150 or the transition layer region 140 is in contact with the floating gate region 130 is smaller than the total area of the floating gate region 130, each area may be equal to or greater than the area of the floating gate region 130.

As described above, in an embodiment, all of the channel region 110, the source region 111, and the drain region 112 may be formed on the substrate 105. For example, the channel region 110 may be formed to have a nanowire structure. In this case, as shown in FIG. 3, the gate insulating film region 120, the floating gate region 130, the transition layer region 140, and the control gate region 150 may be formed to sequentially surround a portion of the channel region 110. An empty space may be present between the rest of the channel region 110 and the substrate 105. In other words, the channel region 110 may be supported by the components 120, 130, 140, 150 so as to float like a bridge on the substrate 105.

As shown in FIG. 1B, the DRAM device 100 having this structure may be connected in an array structure filled with shallow trench isolation between transistors, thereby implementing a DRAM array.

Figure 6:
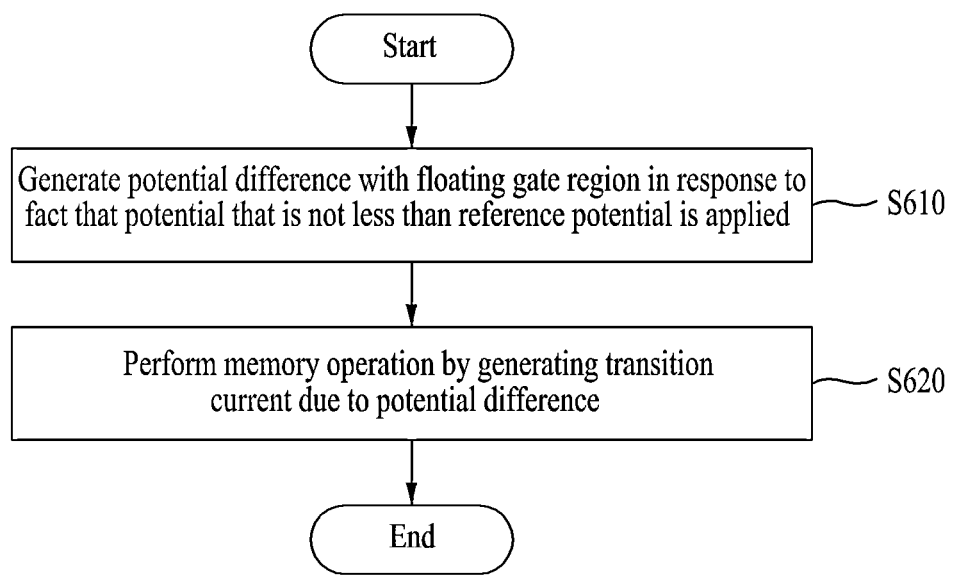
FIG. 6 is a flowchart illustrating an operating method of the DRAM device shown in FIG. 1A.

FIG. 6 is a flowchart illustrating an operating method of the DRAM device shown in FIG. 1A. Hereinafter, an operating method to be described may be performed by the DRAM device 100 (more precisely, the control gate region 150) described with reference to FIGS. 1A, 2, and 3.

Referring to FIG. 6, in operation S610, the DRAM device 100 may generate a potential difference with the floating gate region 130 in response to a fact that a potential that is not less than a reference potential is applied.

Accordingly, in operation S620, the DRAM device 100 may perform a memory operation by generating a transition current due to a potential difference. In more detail, in operation S620, the DRAM device 100 may perform a read operation of releasing at least one charge stored in the floating gate region 130 and may perform a write operation of storing at least one charge into the floating gate region 130. That is, in operation S620, in such a method of changing a resistance state of the channel region 110 in response to a fact that at least one charge passes through an energy barrier by the transition layer region 140 due to a potential difference with the floating gate region 130, the DRAM device 100 may perform a read operation by releasing at least one charge stored in the floating gate region 130 and may perform a write operation by storing at least one charge into the floating gate region 130.

Figure 7:
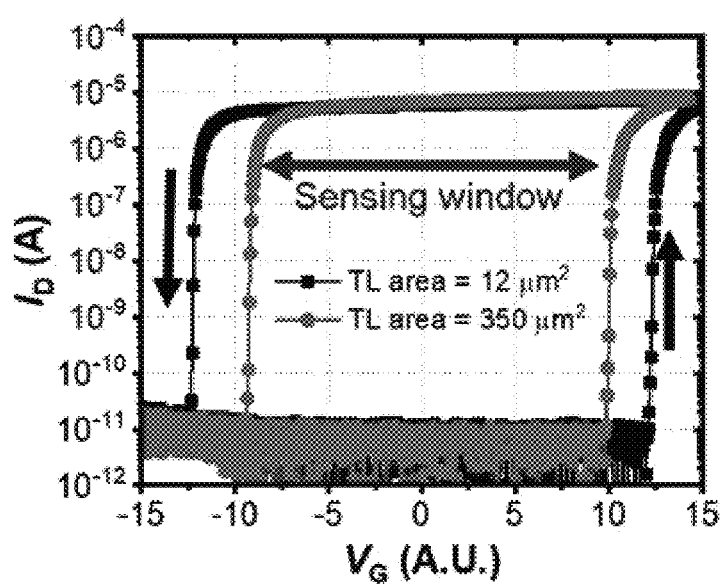
FIG. 7 is a graph from directly measuring a drain current $I_D$ with respect to a voltage $V_G$ of a control gate region of the DRAM device shown in FIG. 1A.

FIG. 7 is a graph from directly measuring a drain current $I_D$ with respect to a voltage $V_G$ of a control gate region of the DRAM device shown in FIG. 1A.

Referring to FIG. 7, when a potential greater than or equal to a reference voltage is applied to the control gate region 150, a graph may have a counterclockwise hysteresis curve. As such, while a voltage of the floating gate region 130 is rapidly changed by rapidly increasing a transition current flowing into the transition layer region 140, a DRAM operation may be performed. As the amount of current flowing through the transition layer 102 increases, a DRAM device may operate rapidly. At this time, a voltage difference in an axis direction of the gate voltage $V_G$ of a hysteresis curve corresponds to a sensing window.

Figure 8:
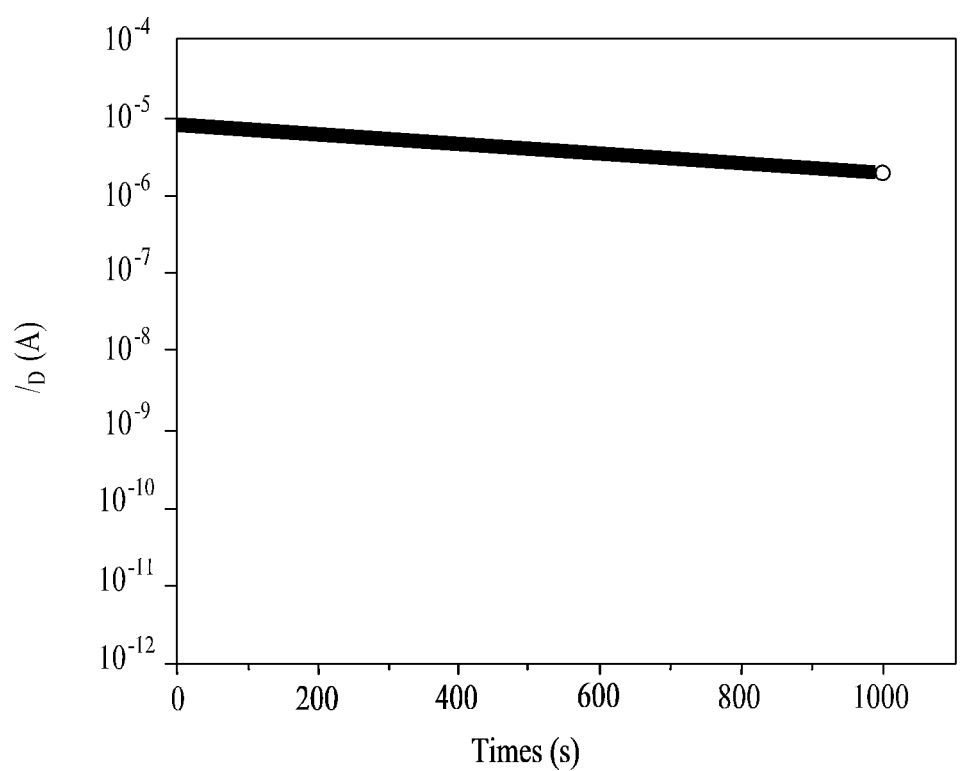
FIG. 8 is a graph illustrating retention characteristics obtained by direct measurement from the DRAM device shown in FIG. 1A.

FIG. 8 is a graph illustrating retention characteristics obtained by direct measurement from the DRAM device shown in FIG. 1A.

Referring to FIG. 8, it may be seen that a current of the drain region 112 is maintained at a level of 50% or more for 400 seconds immediately after programming when a voltage of 0 V is applied to the control gate region 150 and retention is measured. It is known that a conventional DRAM device needs a refresh operation at least every 128 ms. When the DRAM device 100 according to an embodiment is used, the cycle of the refresh operation is increased by 1000 times or more, thereby greatly increasing power efficiency. When a voltage of 0 V is applied to the control gate region 150, a voltage difference between the control gate region 150 and the floating gate region 130 becomes very small, and thus almost no voltage is applied between both ends of the transition layer region 140. Accordingly, because a transition current for releasing charges of the floating gate region 130 is very small, extremely-long retention may be secured.

Figure 9:
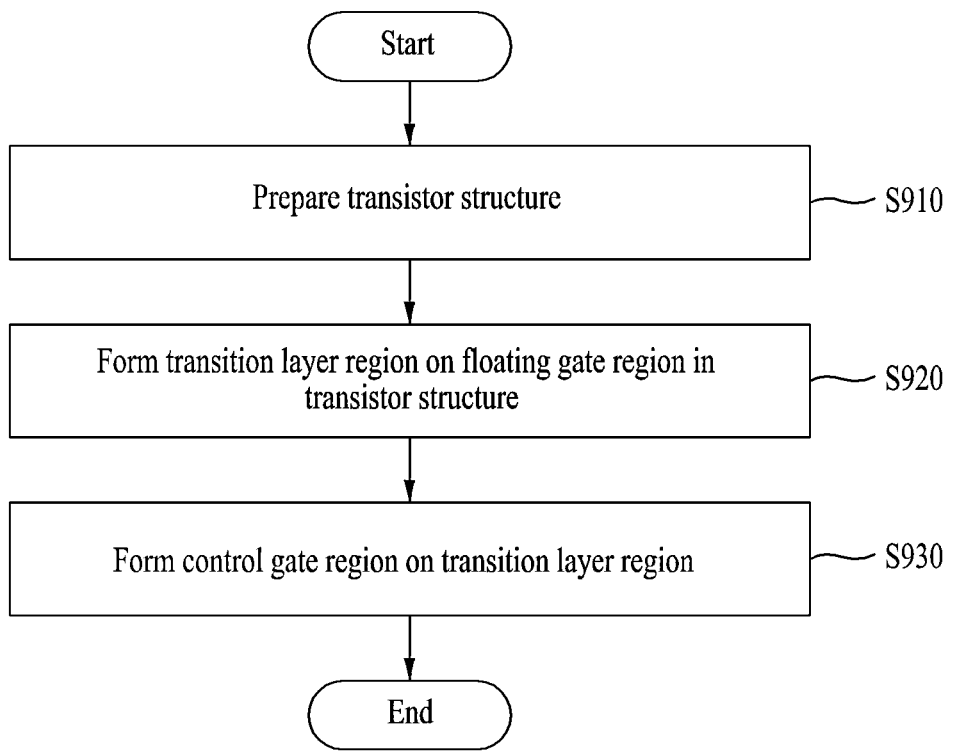
FIG. 9 is a flowchart illustrating a manufacturing method of the DRAM device shown in FIG. 1A.

FIG. 9 is a flowchart illustrating a manufacturing method of the DRAM device shown in FIG. 1A. Hereinafter, a manufacturing method may be performed by an automated and mechanized manufacturing system. The DRAM device 100 having a structure described with reference to FIGS. 1A, 2, and 3 may be obtained by performing the manufacturing method. As such, each of components (the channel region 110, the source region 111 and the drain region 112, the gate insulating film region 120, the floating gate region 130, the transition layer region 140, and the control gate region 150) included in the DRAM device 100 may be composed of the structure and composition described with reference to FIGS. 1A, 2, and 3.

Referring to FIG. 9, in operation S910, the manufacturing system according to an embodiment may prepare a transistor structure including the channel region 110 formed on a substrate, the gate insulating film region 120 formed on the channel region 110, and the floating gate region 130 formed on the gate insulating film region 120.

Then, in operation S920, the manufacturing system may form the transition layer region 140 on the floating gate region 130 in the transistor structure.

Afterwards, in operation S930, the manufacturing system may form the control gate region 150 on the transition layer region 140.

The DRAM device 100 described above may be applied to various devices and systems. For example, the DRAM device 100 may be usefully utilized in various electronic devices such as a mobile phone, a smartphone, a personal digital assistant (PDA), a portable multimedia player (PMP), a digital camera, a camcorder, a personal computer (PC), a server computer, a workstation, a notebook PC, a digital TV, a set-top box, a music player, a portable game console, a navigation device, a wearable device, an IoT device, a VR device, an AR device, and the like.

While a few embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

Embodiments of the inventive concept provide a DRAM device that implements long retention characteristics, has a structure in which an upper gate region is modified instead of a channel region to improve compatibility with conventional processes, reduces process complexity and manufacturing cost, and has a reduced chip size by removing a sense amplifier, which has been essentially used in the conventional 1T-1C DRAM, to implement a very large sensing window while solving structural limitations of the conventional 1T-1C DRAM and 1T-DRAM devices by not using capacitors and floating bodies.

However, the effects of the inventive concept are not limited to the effects, and may be variously expanded without departing from the spirit and scope of the inventive concept.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A DRAM device comprising:
   a channel region formed on a substrate;
   a gate insulating film region formed on the channel region;
   a floating gate region formed on the gate insulating film region, the floating gate region having a lower surface in contact with the gate insulating film region and an opposing upper surface;
   a transition layer region formed on the upper surface of the floating gate region wherein an area of the transition layer that is in contact with the floating gate region is smaller than a total area of the upper surface of the floating gate region; and
   a control gate region formed on the transition layer region, wherein the control gate region is configured to:
   generate a potential difference with the floating gate region in response to a fact that a potential that is not less than a reference potential is applied; and
   release at least one charge stored in the floating gate region or store the at least one charge into the floating gate region, by generating a transition current due to the potential difference.

2. The DRAM device of claim 1, wherein the control gate region performs a read operation by releasing the at least one charge stored in the floating gate region and performs a write operation by storing the at least one charge into the floating gate region.

3. The DRAM device of claim 2, wherein the control gate region performs the read operation or the write operation in a method of changing a resistance state of the channel region in response to a fact that the at least one charge passes through an energy barrier by the transition layer region due to the potential difference with the floating gate region.

4. The DRAM device of claim 1, wherein an area of the control gate region is smaller than the total area of the upper surface of the floating gate region.

5. The DRAM device of claim 1, wherein the control gate region is formed of at least one material of a metal, a two or three metal alloy, n+ polycrystalline silicon, p+ polycrystalline silicon, or silicide.

6. The DRAM device of claim 1, wherein the transition layer region is formed of at least one material of silicon (Si), germanium (Ge), group III-V compound, 2-D material, silicon nitride ($Si_3N_4$), nitride, silicon oxynitride (SiON), silicon oxide ($SiO_2$), oxide, aluminum oxide ($Al_2O_3$), IGZO, hafnium oxide ($HfO_2$), a transition layer material, a semiconductor material, or a solid electrolyte material.

7. The DRAM device of claim 1, wherein the floating gate region has one structure among a protruded gate structure including a planar-gate structure, a multiple-gate structure, and a gate-all-around structure or a buried gate structure depending on a structure of the channel region.

8. The DRAM device of claim 7, wherein the floating gate region has the protruded gate structure used in one of a finFET, a tri-gate MOSFET, a Π-gate MOSFET, a Ω-gate MOSFET, a gate-all-around MOSFET, a bulk finFET, or a bulk gate-all-around MOSFET.

9. The DRAM device of claim 7, wherein the floating gate region has the buried gate structure used in at least one of a buried gate MOSFET, a recessed gate MOSFET, a sphere-shaped recessed gate MOSFET, a saddle finFET, a groove gate MOSFET, or a V-groove gate MOSFET.

10. The DRAM device of claim 1, wherein the floating gate region is formed of at least one material of a metal, a two or three metal alloy, n+ polycrystalline silicon, p+ polycrystalline silicon, or silicide.

11. The DRAM device of claim 1, further comprising:
a source region and a drain region formed on left and right sides of the channel region when the DRAM device is implemented as a horizontal transistor, and formed at upper and lower ends of the channel region when the DRAM device is implemented as a vertical transistor.

12. The DRAM device of claim 11, wherein the source region and the drain region are formed of one of n-type silicon, p-type silicon, or metal silicide.

13. The DRAM device of claim 12, wherein, when the source region and the drain region are formed of the n-type silicon or the p-type silicon, the source region and the drain region are formed based on at least one method of diffusion, solid-phase diffusion, epitaxial growth, selective epitaxial growth, ion implantation or subsequent heat treatment.

14. The DRAM device of claim 12, wherein, when the source region and the drain region are formed of the metal silicide, bonding is improved by using dopant segregation.

15. The DRAM device of claim 11, wherein the channel region, the source region, and the drain region are formed of materials identical to one another.

16. The DRAM device of claim 15, wherein the channel region, the source region, and the drain region are formed of at least one of silicon, germanium, silicon-germanium, strained silicon, strained germanium, strained silicon-germanium, silicon on insulator (SOI), or group III-V semiconductor materials.

17. The DRAM device of claim 1, wherein the channel region has either a protruded channel structure or a buried channel structure, which includes a planar structure, a fin structure, a nanosheet structure, or a nanowire structure.

18. The DRAM device of claim 17, wherein the channel region has the protruded channel structure used in one of a finFET, a tri-gate MOSFET, a Π-gate MOSFET, a Ω-gate MOSFET, a gate-all-around MOSFET, a bulk finFET, or a bulk gate-all-around MOSFET.

19. The DRAM device of claim 17, wherein the channel region has the buried channel structure used in at least one of a buried gate MOSFET, a recessed gate MOSFET, a sphere-shaped recessed gate MOSFET, a saddle finFET, a groove gate MOSFET, or a V-groove gate MOSFET.

20. An operating method of a DRAM device, the method comprising:
accessing the DRAM device including a channel region formed on a substrate, a gate insulating film region formed on the channel region, a floating gate region formed on the gate insulating film region the floating gate region having a lower surface in contact with the gate insulating film region and an opposing upper surface, a transition layer region formed on the upper surface of the floating gate region, wherein an area of the transition layer that is in contact with the floating gate region is smaller than a total area of the upper surface of the floating gate region, and a control gate region formed on the transition layer region;
generating a potential difference with the floating gate region in response to a fact that a potential that is not less than a reference potential is applied; and
performing a memory operation by generating a transition current due to the potential difference,
wherein the performing of the memory operation includes one of:
releasing at least one charge stored in the floating gate region; or
storing the at least one charge into the floating gate region.

21. A manufacturing method of a DRAM device, the method comprising:
preparing a transistor structure including:
forming a channel region on a substrate;
forming a gate insulating film region on the channel region; and
forming a floating gate region on the gate insulating film region the floating gate region having a lower surface in contact with the gate insulating film region and an opposing upper surface; and
forming a transition layer region on the upper surface of the floating gate region, wherein an area of the transition layer that is in contact with the floating gate region is smaller than a total area of the upper surface of the floating gate region; and
forming a control gate region on the transition layer region.

22. A DRAM array, the DRAM array comprising a plurality of DRAM devices each comprising:
a channel region formed on a substrate;
a gate insulating film region formed on the channel region;
a floating gate region formed on the gate insulating film region the floating gate region having a lower surface in contact with the gate insulating film region and an opposing upper surface; and a transition layer region formed on the upper surface of the floating gate region, wherein an area of the transition layer that is in contact with the floating gate region is smaller than a total area of the upper surface of the floating gate region; and
a control gate region formed on the transition layer region, wherein the control gate region is configured to:
generate a potential difference with the floating gate region in response to a fact that a potential that is not less than a reference potential is applied; and
release at least one charge stored in the floating gate region or store the at least one charge into the floating gate region, by generating a transition current due to the potential difference.

* * * * *